(12) United States Patent
Hayasaki et al.

(10) Patent No.: US 7,510,341 B2
(45) Date of Patent: Mar. 31, 2009

(54) TEMPERATURE CALIBRATION METHOD FOR BAKING PROCESSING APPARATUS, ADJUSTMENT METHOD FOR DEVELOPMENT PROCESSING APPARATUS, AND METHOD OF MANUFACTURING SEMICONDUCTOR APPARATUS

(75) Inventors: Kei Hayasaki, Kamakura (JP); Daizo Mutoh, Yokohama (JP); Masafumi Asano, Yokohama (JP); Tadahito Fujisawa, Tokyo (JP); Tsuyoshi Shibata, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 523 days.

(21) Appl. No.: 10/878,310

(22) Filed: Jun. 29, 2004

(65) Prior Publication Data
US 2005/0008979 A1 Jan. 13, 2005

(30) Foreign Application Priority Data
Jun. 30, 2003 (JP) ............................. 2003-188496

(51) Int. Cl.
*G03D 5/00* (2006.01)
(52) U.S. Cl. ........................................ 396/611; 355/27
(58) Field of Classification Search ................. 396/567, 396/571, 578, 611; 355/27
See application file for complete search history.

(56) References Cited

U.S. PATENT DOCUMENTS

| 6,051,349 | A | 4/2000 | Yoshioka et al. |
| 6,191,397 | B1 | 2/2001 | Hayasaki et al. |
| 6,251,544 | B1 | 6/2001 | Inoue et al. |
| 6,376,139 | B1* | 4/2002 | Fujisawa et al. .............. 430/30 |
| 6,423,977 | B1 | 7/2002 | Hayasaki et al. |
| 6,667,139 | B2 | 12/2003 | Fujisawa et al. |

(Continued)

FOREIGN PATENT DOCUMENTS

CN 1383187 A 12/2002

(Continued)

OTHER PUBLICATIONS

Notification of the First Office Action from the State Intellectual Property Office of the People's Republic of China dated Aug. 12, 2005, in patent application No. 200410062569.7, and English translation.

(Continued)

*Primary Examiner*—Della J. Rutledge
(74) *Attorney, Agent, or Firm*—Finnegan, Henderson, Farabow, Garrett & Dunner, L.L.P.

(57) ABSTRACT

A temperature calibration method for a baking apparatus comprising forming a photoresist film onto a substrate, forming a latent image of a dose monitor mark onto the photoresist film, preparing baking processing apparatuses, baking the substrate or another substrate by temperature settings performed every repeat of a series of the forming the resist film and the forming the latent image with each prepared baking apparatus, cooling the baking-processed substrate, measuring a length of the latent image of the dose monitor mark after the cooling or a length of a dose monitor mark which being obtained by developing the resist film, determining relationship between a temperature setting and an effective dose in advance, and calibrating temperature settings corresponding to the each baking processing apparatus to be obtained a predetermined effective dose on the basis of the determining relationship and the measured length corresponding to the each baking processing apparatus.

32 Claims, 12 Drawing Sheets

U.S. PATENT DOCUMENTS 6,831,258 B2 * 12/2004 Hayasaki et al. ............ 219/502

FOREIGN PATENT DOCUMENTS

| JP | 07-029873 | 1/1995 |
| JP | 11-8180 | 1/1999 |
| JP | 11-067619 | 3/1999 |
| JP | 2001-102282 | 4/2001 |
| JP | 2001-272922 | 10/2001 |
| JP | 2001-284246 | 10/2001 |
| JP | 2002-064047 | 2/2002 |
| JP | 2002-177840 | 6/2002 |
| JP | 2002-208560 | 7/2002 |
| JP | 2002 299205 | 10/2002 |
| JP | 2003-100594 | 4/2003 |
| JP | 2003-158056 | 5/2003 |

OTHER PUBLICATIONS

Notification of Reasons for Rejection from the Japanese Patent Office, mailed Mar. 1, 2007, in Japanese patent application No. 2003-188496, and English translation.

Notification of Reasons for Rejection mailed Dec. 4, 2007, in Japanese Patent Application No. 2007-220236, with English translation (10 pages).

Decision of Rejection mailed Nov. 20, 2007, in Japanese Patent Application No. 2003-188496, with English translation (5 pages).

* cited by examiner

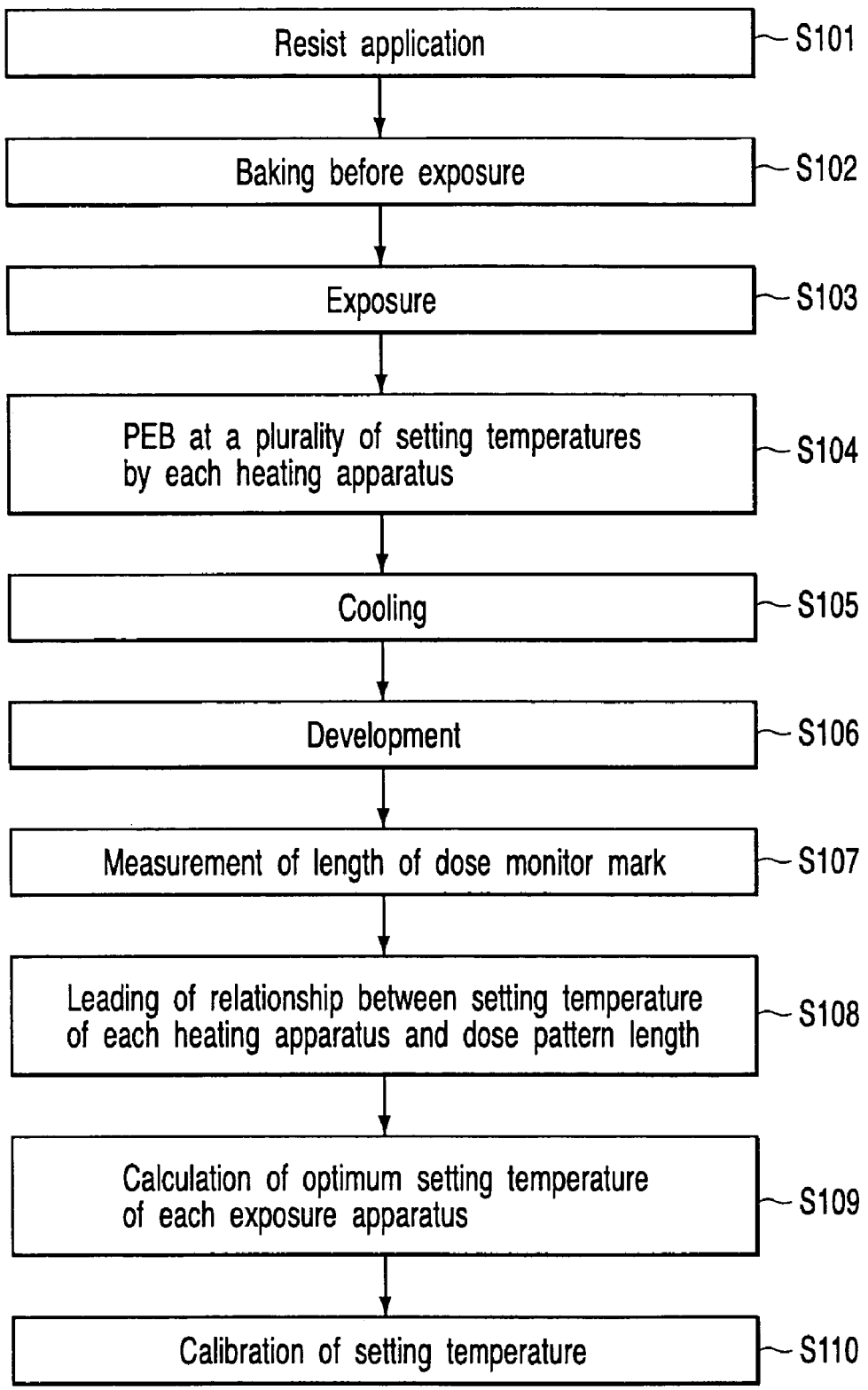
F I G. 1

|  | -90.00 | -60.00 | -30.00 | 0.00 | 30.00 | 60.00 | 90.00 |
|---|---|---|---|---|---|---|---|
| 90.00 |  |  | 24.93 | 24.91 | 24.93 |  |  |
| 60.00 |  | 24.93 | 24.95 | 24.95 | 24.94 | 24.93 |  |
| 30.00 | 24.93 | 24.94 | 24.96 | 24.96 | 24.96 | 24.95 | 24.93 |
| 0.00 | 24.93 | 24.95 | 24.96 | 24.98 | 24.98 | 24.96 | 24.91 |
| -30.00 | 24.93 | 24.95 | 24.95 | 24.96 | 24.98 | 24.98 | 24.93 |
| -60.00 |  | 24.93 | 24.94 | 24.95 | 24.95 | 24.93 |  |
| -90.00 |  |  | 24.93 | 24.94 | 24.93 |  |  |

[μm]

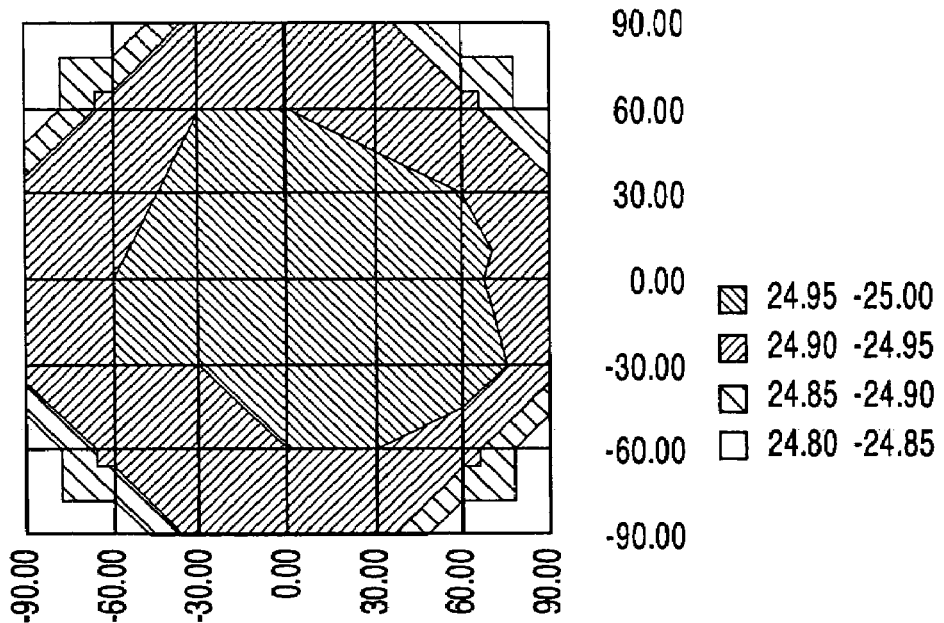
F I G. 16
| | -90.00 | -60.00 | -30.00 | 0.00 | 30.00 | 60.00 | 90.00 |
|---|---|---|---|---|---|---|---|
| 90.00 | | | 130.20 | 130.30 | 130.20 | | |
| 60.00 | | 130.20 | 130.00 | 130.00 | 130.10 | 130.20 | |
| 30.00 | 130.20 | 130.10 | 129.90 | 129.90 | 129.90 | 130.00 | 130.20 |
| 0.00 | 130.20 | 130.00 | 129.90 | 129.80 | 129.80 | 129.90 | 130.30 |
| -30.00 | 130.20 | 130.00 | 130.00 | 129.90 | 129.80 | 129.80 | 130.20 |
| -60.00 | | 130.20 | 130.10 | 130.00 | 130.00 | 130.20 | |
| -90.00 | | | 130.20 | 130.10 | 130.20 | | |
[°C]
F I G. 17
| | -90.00 | -60.00 | -30.00 | 0.00 | 30.00 | 60.00 | 90.00 |
|---|---|---|---|---|---|---|---|
| 90.00 | | | 14.87 | 14.87 | 14.88 | | |
| 60.00 | | 14.90 | 14.92 | 14.91 | 14.91 | 14.89 | |
| 30.00 | 14.91 | 14.92 | 14.94 | 14.94 | 14.94 | 14.93 | 14.91 |
| 0.00 | 14.93 | 14.96 | 14.95 | 14.98 | 14.98 | 14.96 | 14.91 |
| -30.00 | 14.94 | 14.97 | 14.97 | 14.98 | 15.00 | 14.99 | 14.94 |
| -60.00 | | 14.96 | 14.97 | 14.98 | 14.99 | 14.96 | |
| -90.00 | | | 14.98 | 14.94 | 14.98 | | |
(μm)
F I G. 18

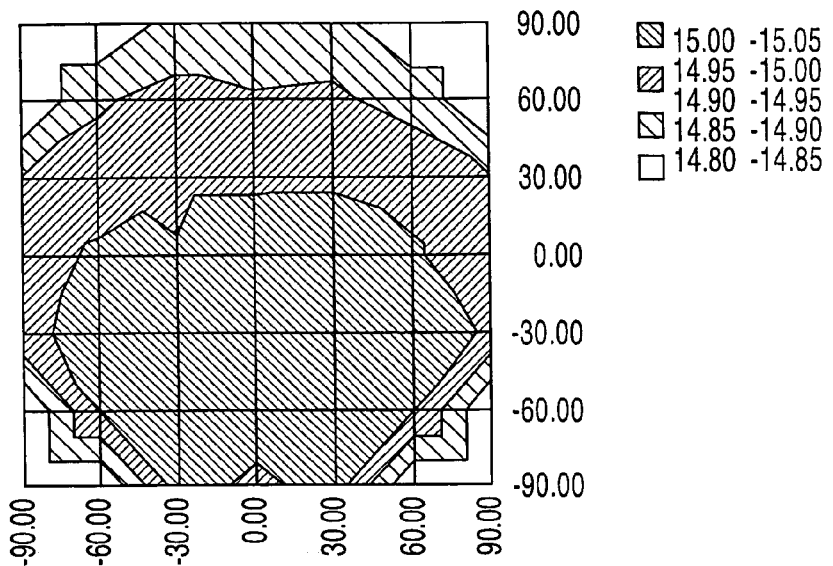
FIG. 19
| | -90.00 | -60.00 | -30.00 | 0.00 | 30.00 | 60.00 | 90.00 |
|---|---|---|---|---|---|---|---|
| 90.00 | | | 0.89 | 0.91 | 0.90 | | |
| 60.00 | | 0.94 | 0.93 | 0.91 | 0.94 | 0.92 | |
| 30.00 | 0.96 | 0.96 | 0.96 | 0.96 | 0.96 | 0.96 | 0.96 |
| 0.00 | 1.00 | 1.02 | 0.98 | 1.00 | 1.01 | 0.99 | 1.00 |
| -30.00 | 1.03 | 1.03 | 1.03 | 1.03 | 1.04 | 1.03 | 1.03 |
| -60.00 | | 1.06 | 1.07 | 1.06 | 1.07 | 1.06 | |
| -90.00 | | | 1.10 | 1.00 | 1.10 | | |
(mm)
FIG. 20
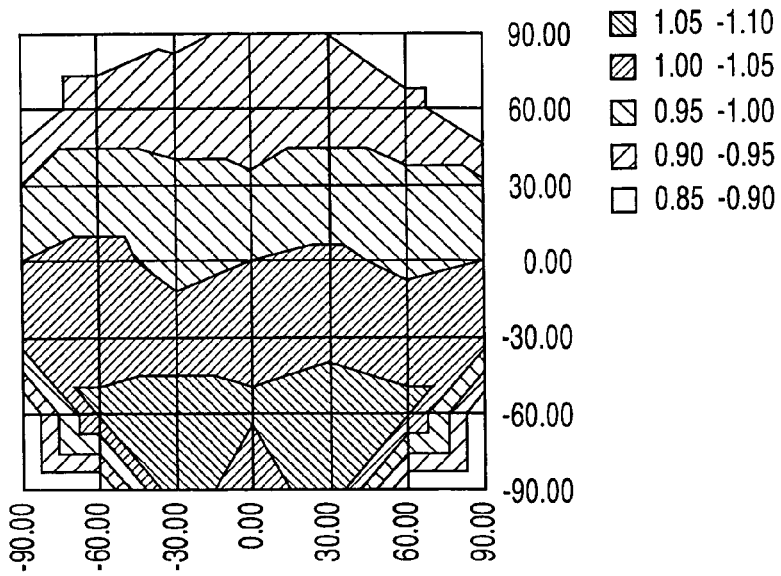
FIG. 21

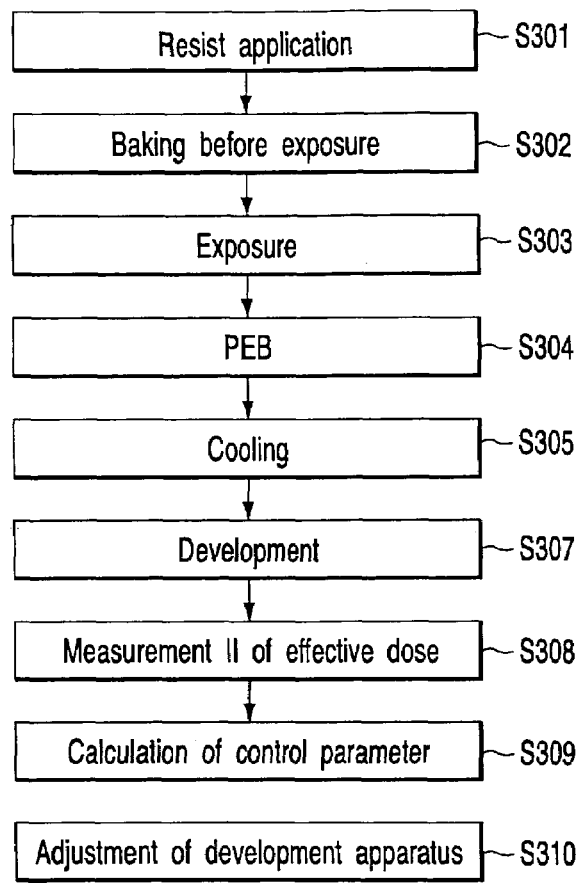
F I G. 22
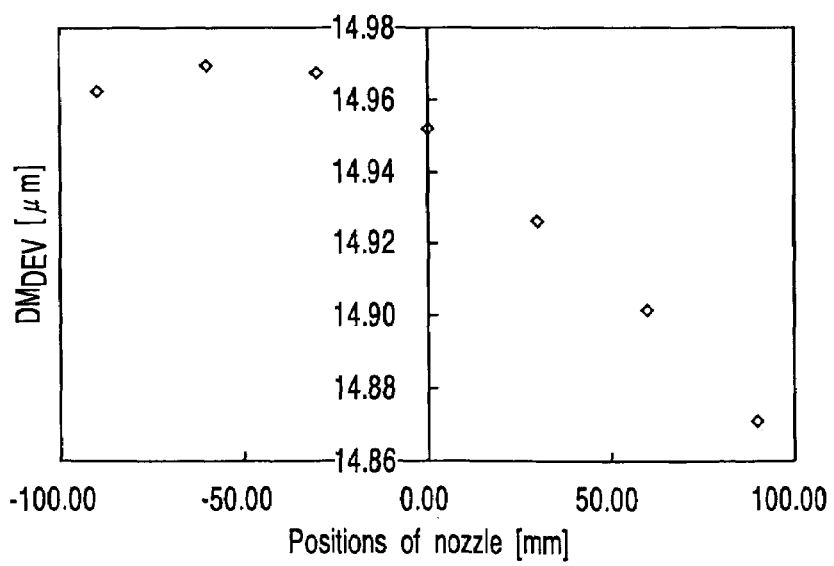
F I G. 23

TEMPERATURE CALIBRATION METHOD FOR BAKING PROCESSING APPARATUS, ADJUSTMENT METHOD FOR DEVELOPMENT PROCESSING APPARATUS, AND METHOD OF MANUFACTURING SEMICONDUCTOR APPARATUS

CROSS-REFERENCE TO RELATED APPLICATIONS

This application is based upon and claims the benefit of priority from prior Japanese Patent Application No. 2003-188496, filed Jun. 30, 2003, the entire contents of which are incorporated herein by reference.

BACKGROUND OF THE INVENTION

1. Field of the Invention

The present invention relates to a temperature calibration method for a baking processing apparatus which is used for baking processing after exposure of a photosensitive resin film, an adjustment method for a development processing apparatus which is used for development processing for a photosensitive resin film, and a method of manufacturing a semiconductor apparatus for which an apparatus which is calibrated or adjusted by using the temperature calibration method for a baking processing apparatus or the adjustment method for a development processing apparatus is used.

2. Description of the Related Art

In a photolithography process in the manufacture of a semiconductor integrated circuit, in order to carry out a pattern exposure, an exposure light having passed through a mask on which a mask pattern is formed by an exposure apparatus is projected onto a resist film formed on a wafer, and the desired pattern is transferred onto the resist film.

In accordance with a demand for making a pattern fine, making the wavelength of an exposure light shorter, and making a projection lens have a high numerical aperture (N/A) ratio have been carried out. At the same time therewith, an improvement of the process has been carried out. However, the demand for making a device pattern fine in recent years has been more severe, and it is difficult to sufficiently obtain an dose tolerance or a process margin for depth of focus, which has caused a reduction in yield.

In order to carry out photolithography with a small process margin, a precise analysis of errors using the process margin and an error distribution (error budget) have come to be regarded as important. For example, even with the intention of exposing a large number of chips on a wafer at the same setting dose, due to a variation in sensitivity of the resist, post exposure bake (PEB), the ununiformity of development within the wafer surface, fluctuation in film thickness within the wafer surface of the resist, or the like, an effective appropriate dose is made to disperse, which causes a reduction in yield. Therefore, in order to prevent yield from being reduced due to a small margin being effectively used, a method of controlling a higher precise dose, a dose by which focus is monitored and is fed-back or fed-forward, and focus are required. Moreover, it is necessary to carry out a precise analysis of the error factor using a process margin, and to improve the main error factor on the basis of the analyzed result.

A technique in which an effective dose which does not depend on focus is measured, and a fluctuation in the dose between lots on the basis of the measured dose is disclosed in U.S. Pat. No. 6,667,139.

BRIEF SUMMARY OF THE INVENTION

According to an aspect of the present invention, there is provided a temperature calibration method for a baking processing apparatus, comprising: forming a photosensitive resin film onto a substrate; preparing an exposure mask having disposed thereon a mask pattern for dose monitor mark to monitor an effective dose on a substrate; forming a latent image of the dose monitor mark by transferring the mask pattern for dose monitor mark onto the photosensitive resin film at a predetermined dose, by using an exposure apparatus; preparing baking processing apparatuses; baking the substrate or another substrate by predetermined temperature setting performed every repeat of a series of the forming the resist film and the forming the latent image, with each prepared baking processing apparatus; cooling the baking-processed substrate; measuring a length of the latent image of the dose monitor mark after the cooling or a length of a dose monitor mark which being obtained by developing the photosensitive resin film on the cooling-processed substrate; determining relationship between a temperature setting and an effective dose in advance; and calibrating temperature settings corresponding to the each baking processing apparatus to be obtained a predetermined effective dose with which photosensitive the resin films baked using the each baking processing apparatus on the basis of the determining relationship and the measured length corresponding to the each baking processing apparatus.

According to another aspect of the present invention, there is provided a temperature calibration method for a baking processing apparatus, comprising: forming a photosensitive resin film onto substrate; preparing an exposure mask having disposed thereon a mask pattern for dose monitor mark to monitor an effective dose on a substrate; preparing a baking processing apparatus having a plurality of heat sources: forming a latent images of the dose monitor mark by transferring, at a predetermined setting dose, the mask pattern for dose monitor mark onto the photosensitive resin film at a position corresponding to a position of the heat source, by using an exposure apparatus; baking the substrate having the latent images of dose monitor mark formed thereon using the baking processing apparatus with set predetermined temperature setting corresponding to the each heat source; cooling the baking-processed substrate; measuring lengths of the latent images of the dose monitor marks after the cooling or a length of a dose monitor mark which being obtained by developing the photosensitive resin film on the cooling-processed substrate; determining a relationship between a temperature setting and a length of the latent image the dose monitor mark, or a temperature setting and a length of the dose monitor mark corresponding to each heat source in advance; and calibrating the temperature settings corresponding to the each heat source to be obtained a same dose at positions of the photosensitive resin film corresponding to the each heat source, on the basis of each determined relationship and the measured length corresponding to the each heat source.

According to another aspect of the present invention, there is provided an adjusting method for a development processing apparatus, comprising: forming a photosensitive resin film onto a substrate; preparing an exposure mask having disposed thereon a mask pattern for dose monitor mark to monitor an effective dose obtained by the photosensitive resin film; forming latent images of dose monitor marks by transferring the mask pattern for dose monitor mark onto positions of the photosensitive resin film at a predetermined setting dose; baking the substrate or another substrate by temperature settings performed every repeat of a series of the forming the resist film and the forming the latent image; cooling the baking-processed substrate; measuring lengths of the latent images of dose monitor marks after the cooling; developing the photosensitive resin film by using a development processing apparatus with which a control parameter being set up to form dose monitor marks; measuring lengths of dose monitor marks after the developing; calculating a optimum control parameter of the development processing apparatus on the basis of the lengths of the latent images of dose monitor marks and the lengths of dose monitor marks; and setting the optimum control parameter as the development processing apparatus.

According to another aspect of the present invention, there is provided an adjusting method for a development processing apparatus, comprising: forming a photosensitive resin film onto a substrate; preparing an exposure mask having disposed thereon a mask pattern for dose monitor mark to monitor an effective dose obtained by the photosensitive resin film; forming latent images of dose monitor marks by transferring the mask pattern for dose monitor mark onto positions of the photosensitive resin film at a predetermined setting dose; baking the substrate having the latent images of the dose monitor marks formed thereon; cooling the baking-processed substrate; preparing a development processing apparatus which discharges a developing solution to the photosensitive resin film, and which causes a nozzle whose length in a longitudinal direction thereof is greater than a maximum width of the substrate to be relatively scanned with respect to the substrate; developing the photosensitive resin film by using a development processing apparatus with which a control parameter being set up to form dose monitor marks; measuring lengths of the dose monitor marks after the developing; calculating average values of lengths of the dose monitor marks positioned on lines scanned by a position where the nozzle exists; determining a distribution of the lengths of the dose monitor marks in the longitudinal direction of the nozzle on the basis of the average values; calculating control parameter of the development processing apparatus on the basis of the lengths of the latent images of dose monitor marks and the lengths of dose monitor marks; and adjusting the control parameter of the development processing apparatus in accordance with the calculated control parameter.

According to another aspect of the present invention, there is provided an adjusting method for a development processing apparatus, comprising: forming a photosensitive resin film onto a substrate; preparing a exposure mask having disposed thereon a mask pattern for dose monitor mark to monitor an effective dose obtained by the photosensitive resin film; forming latent images of dose monitor marks by transferring the mask pattern for dose monitor mark onto positions of the photosensitive resin film at a predetermined setting dose, baking the substrate having the latent images of the dose monitor marks formed thereon; cooling baking-processed substrate; measuring a length of the latent image of the dose monitor mark after the cooling; calculating an average value of the lengths of the latent images of the dose monitor marks measured after the cooling; preparing development processing apparatuses; developing the photosensitive resin film performed every repeat of a series of the forming the photosensitive resin film, the forming the latent images, the baking, the cooling, the measuring and the calculating, with each development processing apparatus, to form dose monitor marks; measuring lengths of dose monitor marks corresponding to the each development processing apparatus after the developing; calculating an average values of the lengths of the dose monitor marks corresponding to the each development processing apparatus on the basis of the length of each dose monitor marks; calculating control parameters corresponding to the each development processing apparatus on the basis of the average value of the lengths of the latent images of the dose monitor marks, and the average value of the lengths of the exposure value monitor marks; and setting the optimum control parameter which is selected from the optimum control parameters as the development processing apparatus corresponding to the selecting optimum parameter.

According to another aspect of the present invention, there is provided an adjusting method for a development processing apparatus, comprising: forming a photosensitive resin film onto a substrate; preparing an exposure mask having disposed thereon a mask pattern for dose monitor mark to monitor an effective dose obtained by the photosensitive resin film; forming latent images of dose monitor marks by transferring the mask pattern for dose monitor mark onto positions of the photosensitive resin film at a predetermined setting dose; baking the substrate having the latent images for the dose monitor marks formed thereon; cooling the baking-processed substrate; preparing a plurality of development processing apparatuses; developing the photosensitive resin film to form dose monitor marks performed every repeat of a series of the forming the photosensitive resin film, the forming the latent images, the baking and the cooling, with the each development processing apparatus; measuring a length of each of the dose monitor marks corresponding to the each development processing apparatus after the developing; calculating average values of the lengths of the dose monitor marks corresponding to the each development processing apparatus; calculating control parameters corresponding to the each development processing apparatus on the basis of the average values of the lengths of the dose monitor marks corresponding to the each development processing apparatus; and adjusting the control parameters of the each development processing apparatus in accordance with the calculated control parameters.

BRIEF DESCRIPTION OF THE SEVERAL VIEWS OF THE DRAWING

FIG. 1 is a flowchart showing the procedure of a calibration method for a baking processing apparatus according to a first embodiment of the present invention.

FIG. 16 is a plan view showing a distribution of the dimensions $DM_{PEB}$ of the latent images of the dose monitor marks after baking processing.

FIG. 17 is a plan view showing a distribution of temperatures after baking processing.

FIG. 18 is a table showing a distribution of the dimensions $DM_{DEV}$ of the dose monitor marks after development processing.

FIG. 19 is a plan view showing a distribution of the dimensions $DM_{DEV}$ of the dose monitor marks after development processing.

FIG. 20 is a graph showing a distribution of gaps between a substrate surface and a nozzle.

FIG. 21 is a plan view showing a distribution of the gaps between the substrate surface and the nozzle.

FIG. 22 is a flowchart showing the procedure of a calibration method according to the third embodiment.

FIG. 23 is a graph showing a distribution of average values of dose monitor mark lengths $DM_{DEV}$ on lines scanned by a position where the nozzle exists.

DETAILED DESCRIPTION OF THE INVENTION

Hereinafter, embodiments of the present invention will be described with reference to the drawings.

First Embodiment

FIG. 1 is a flowchart showing the procedure of a calibration method for a baking processing apparatus according to a first embodiment of the present invention.

Figure 2:
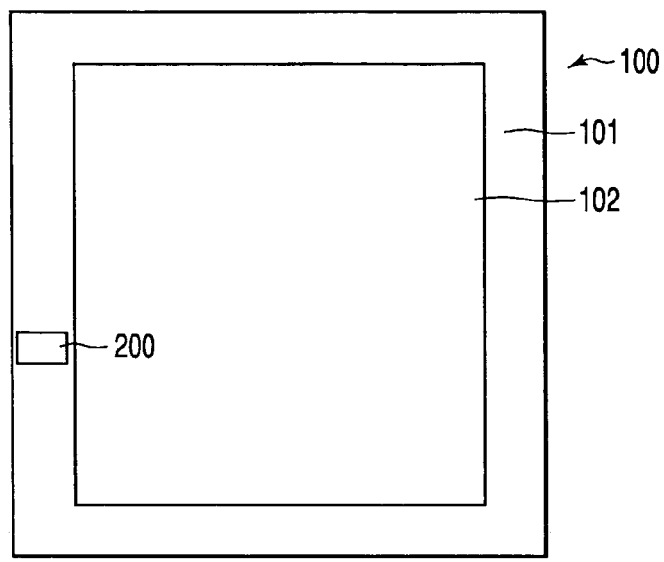
FIG. 2 is a plan view illustrating a configuration of a photomask according to the first embodiment.

First, after a photoresist film is applied to be formed on a substrate (S101), baking before exposure is carried out (S102). Next, a photomask shown in FIG. 2 is prepared. A mask pattern for dose monitor mark 200 is formed on the photomask 100. The mask pattern for dose monitor mark 200 is a mask pattern for forming a dose monitor mark whose dimension varies dependently on not a focal position but only a dose. The mask pattern for dose monitor mark 200 is formed at a dicing region at the periphery of a device region having a device pattern formed thereon.

Figure 3:
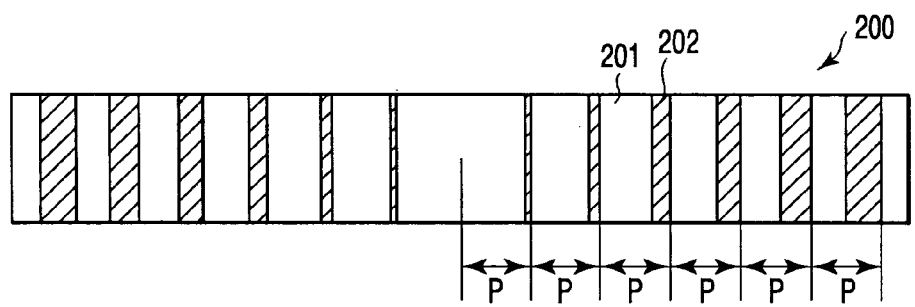
FIG. 3 is a plan view illustrating a configuration of a dose monitor mark according to the first embodiment.

As shown in FIG. 3, in the mask pattern for dose monitor mark 200, a translucent portion 201 and a shielding portion 202 are arranged in a block having a constant width p which is not resolved by an exposure apparatus. A plurality of blocks are serially arranged in the arranging direction of the translucent portions 201 and the shielding portions 202 in the blocks. Further, in the arranging direction, a duty ratio between the translucent portion 201 and the shielding portion 202 in the block is monotonously varied. Note that a plurality of blocks may be intermittently arranged.

A case in which a mask in which an effective dose thereof is to be monitored is set at an exposure apparatus having a numerical aperture NA, a coherent factor σ, and an exposure wavelength λ will be considered. The condition of the width of the block which is not resolved by this apparatus is introduced from a diffraction theory. The condition in which the block is not resolved is shown in formula (1):

$$\lambda/P \geq (1+\sigma)NA \qquad (1)$$

wherein P is a width in an arranging direction of projected images corresponding to the aforementioned block when the mask pattern for dose monitor mark is projected on a resist film by using the exposure apparatus.

By setting the width of the block of the above-described monitor mark so as to satisfy the condition of formula (1), a diffracted light (a first-order or more diffracted light) at the dose monitor mark is not incident into a pupil of the projection lens, but only a straight light (zero-order diffracted light) is made to be incident into the pupil. By satisfying the above-described condition, the respective blocks of the monitor mark are less than or equal to a resolution limit. Further, the respective blocks of the dose monitor mark have a pitch less than or equal to the resolution limit, the respective block are not resolved, and the exposure is made to be flat exposure in which doses reaching the wafer surface are different in accordance with an opening ratio. Therefore, even when the setting doses of the exposure apparatuses are the same, effective doses are varied in accordance with an opening ratio. With respect to the dose in this case, because the respective blocks of the dose monitor mark are not resolved, effects by fluctuation in focus can be completely eliminated.

In consideration of the fact that the exposure condition to be used is given that exposure wavelength λ=248 nm, NA=0.68, and σ=0.75, the width P of the block is made to be 0.2 μm (a dimension converted into wafer) such that a cycle of the monitor marks satisfies formula (1) which is the condition in which the primary or more diffracted light of the mask pattern is not incident into the pupil of the projection lens and only the zero-order diffracted light is incident into the pupil.

Figure 4:
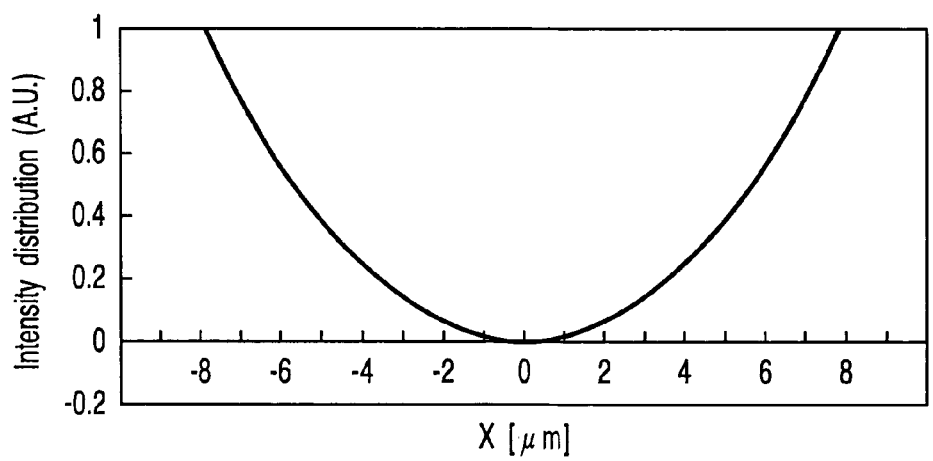
FIG. 4 is a graph showing an intensity distribution, on a wafer, which is obtained when the dose monitor marks shown in FIG. 3 are transferred on a photoresist film.
Figure 5:
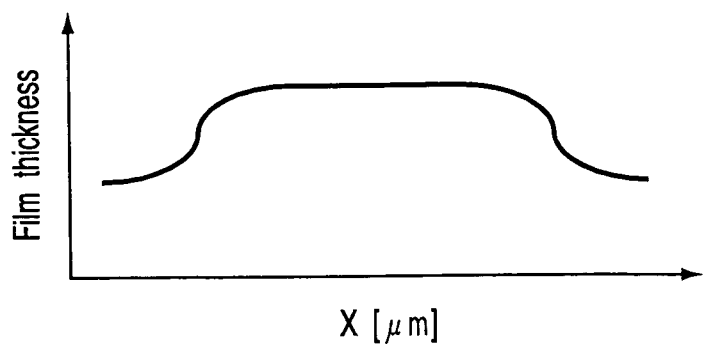
FIG. 5 is a graph showing a film thickness distribution of the photoresist film after baking processing and cooling processing.
Figure 6:
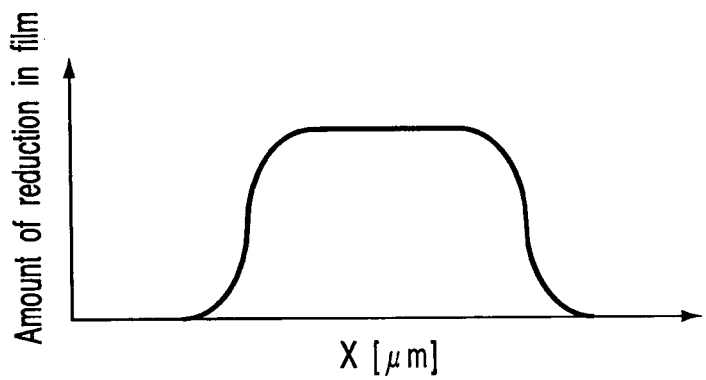
FIG. 6 is a graph showing a film thickness distribution of the photoresist film after development processing.

FIG. 4 shows an intensity distribution, on the wafer surface, which is obtained when the mask pattern for dose monitor mark shown in FIG. 3 is transferred on a photoresist film. On the wafer surface, because only the zero-order diffracted light diffracted at the mask pattern for monitor mark is irradiated, the image intensity distribution is made to be a distribution which is proportional to the square of the area of the translucent portion. Accordingly, when baking after exposure and cooling are carried out by using this mask, a latent image of the dose monitor mark is formed on the photoresist film, which is made to be a film thickness distribution as shown in FIG. 5. By measuring the length of the latent image of the mark by an optical line width length measuring apparatus, an effective dose after baking processing can be obtained. Further, after development processing, the photoresist film has a film thickness distribution as shown in FIG. 6. This mark is measured by an optical line width length measuring apparatus, whereby an effective dose after the development processing can be obtained.

By using the photomask shown in FIG. 2, a mask pattern for dose monitor mark is transferred on the photoresist film formed on the substrate at a predetermined dose, and an latent image of the dose monitor mark is formed (step S103).

Under the above-described condition, samples performed every repeat of a series of the steps S101 to S103 are baked by temperature settings with each baking processing apparatus (step S104). After the cooling the substrate (step S105), a dose monitor mark is formed by developing the resist film (step S106). The condition of the cooling processing and the development processing after the baking processing are the same for each sample.

Figure 7:
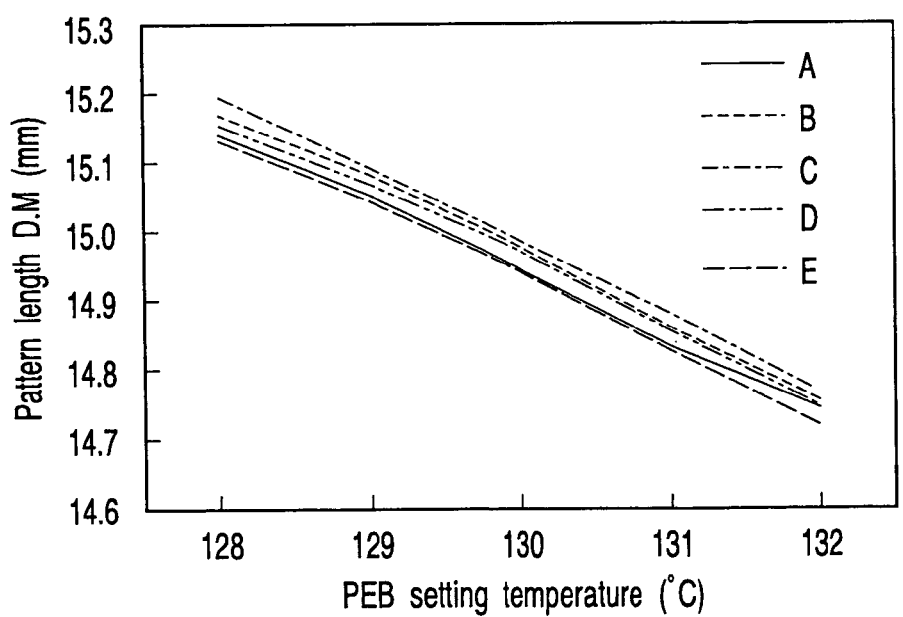
FIG. 7 is a graph showing a correlation graph of respective baking processing apparatuses A to E and pattern lengths D.M.

The lengths of the dose monitor marks of the respective samples are measured (step S107). Further, the relationship between the PEB temperature settings and the lengths of the marks (effective doses) D.M (μm) corresponding to the respective baking processing apparatuses is determined (step S108). A correlation graph of the temperature settings and the mark lengths D.M corresponding to the respective baking processing apparatuses A to E is shown in FIG. 7. An approximate expression is determined in accordance with this graph, optimum temperatures by which the effective doses made to be the same (the mark lengths D.M are the same) are calculated on the basis of the approximate expression, and the optimum temperature settings of the respective apparatuses are determined (step S109). Calibrations of the temperature settings of the respective baking processing apparatuses are carried out on the basis of the calculated temperature settings (step S110).

The lengths of the dose monitor marks "D.M", the critical dimensions "CD" before calibration and after calibration, and the estimated temperatures before calibration are shown in Table 1.

TABLE 1

|   | Before calibration | | | After calibration | |
|---|---|---|---|---|---|
|   | D.M [μm] | CD [nm] | Estimated temperatures [° C.] | D.M [μm] | CD [nm] |
| A | 14.945 | 0.1923 | 130.24 | 14.934 | 0.1962 |
| B | 14.976 | 1.1957 | 129.95 | 14.938 | 0.1946 |
| C | 14.985 | 0.1962 | 129.85 | 14.954 | 0.1965 |
| D | 14.968 | 0.1951 | 130.02 | 14.93  | 0.1944 |
| E | 14.939 | 0.1961 | 130.29 | 14.955 | 0.1961 |

The differences "ΔD.M" between the maximum values and the minimum values of the dose monitor marks, the differences "ΔCD" between the maximum values and the minimum values of the critical dimensions, and the difference "ΔEstimated temperature" between the maximum value and the minimum value of the estimated temperature are shown in Table 2.

TABLE 2

| Before calibration | | | After calibration | |
|---|---|---|---|---|
| ΔD.M [μm] | ΔCD [nm] | ΔEstimated temperatures [° C.] | ΔD.M [μm] | ΔCD [nm] |
| 0.046 | 0.004 | 0.44 | 0.025 | 0.002 |

As shown in Table 2, it was confirmed that differences between the baking processing apparatuses with respect to both of the effective doses (D.M) and the critical dimensions are calibrated.

One example is explained as an applicable example in which the dose monitor marks are used. However, the above-described length measuring means of the marks after exposure is not limited to only an optical microscope or an optical line width length measuring apparatus, but also can be variously applied to a misregistration inspecting apparatus, a SEM, an AFM, or the like. Further, optical line width length measuring means can be variously applied to a phase difference method, a differential interference method, a method of measuring by a light source with multi-wavelength, or the like. Moreover, a misregistration inspecting function, a line width length measuring function, or the like incorporated in the exposure apparatus itself may be used. Although calibrating by changing setting temperature, if it is the parameter that can change the amount of heating, it will not restrict to this. For example, an effect with the same said also of the temperature up speed of a wafer and temperature down speed is acquired.

Second Embodiment

In the present embodiment, one example of a calibration evaluating method for dispersion in the substrate surface when there are a plurality of heat sources in a baking processing apparatus is shown.

Figure 8:
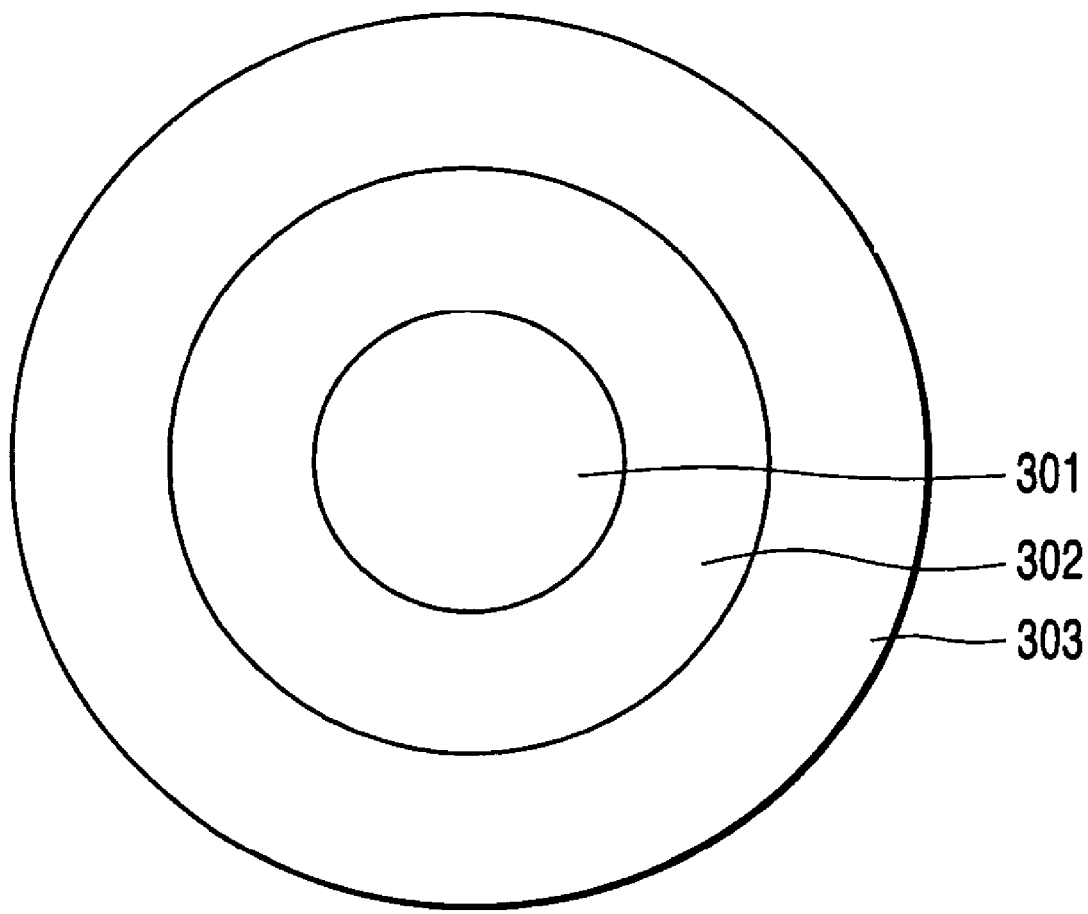
FIG. 8 is a diagram illustrating a configuration of a baking processing apparatus according to a second embodiment of the present invention.
Figure 9:
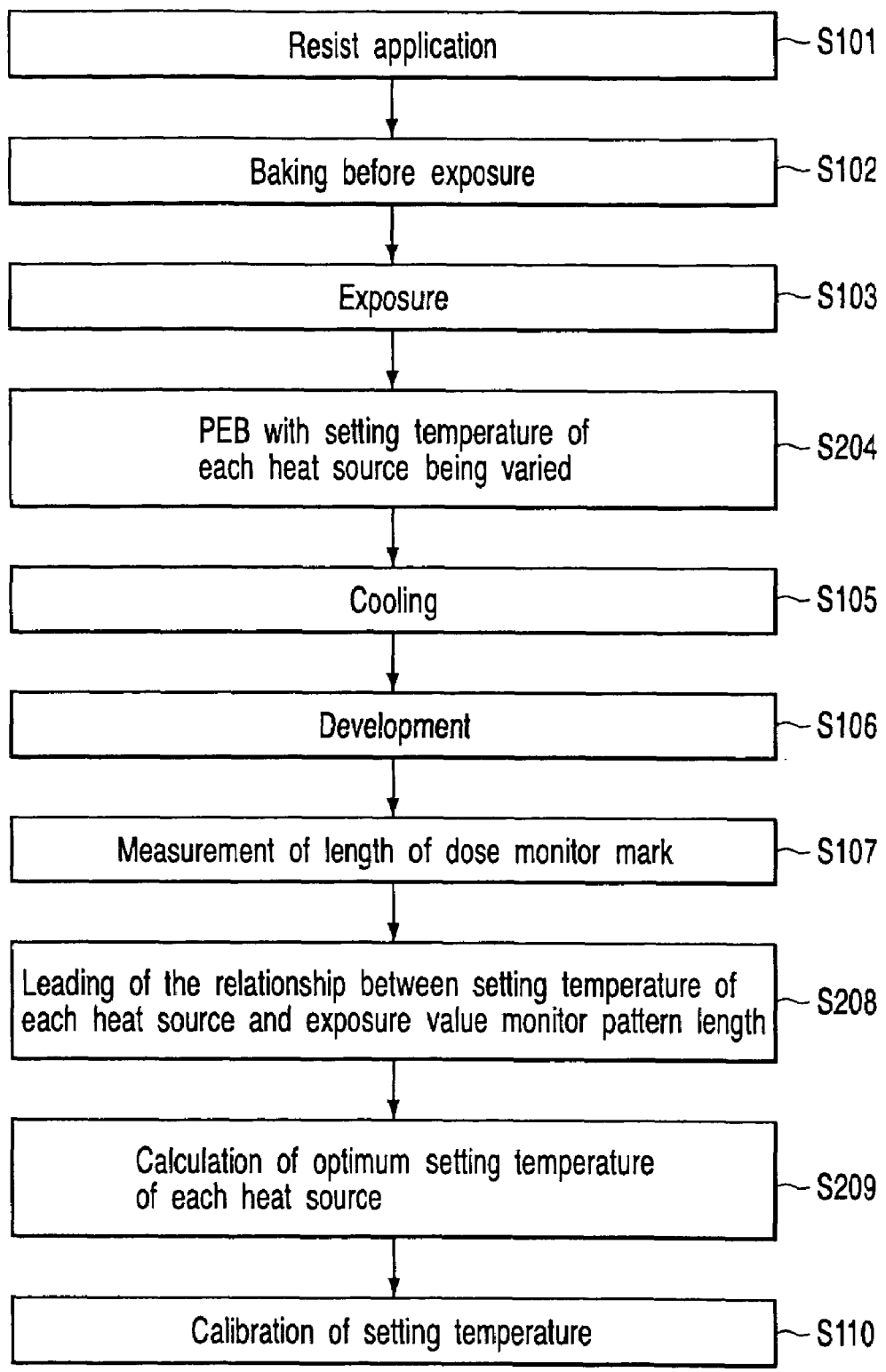
FIG. 9 is a flowchart showing the procedure of a calibration method for the baking processing apparatus according to the second embodiment.

In the present embodiment, a method of calibrating dispersion in the effective doses at the substrate surface when a baking processing apparatus having a plurality of heat sources 301, 302, and 303 shown in FIG. 8 is used will be described. FIG. 9 is a flowchart showing the procedure of a calibration method for the baking processing apparatus according to the second embodiment of the invention.

Figure 10:
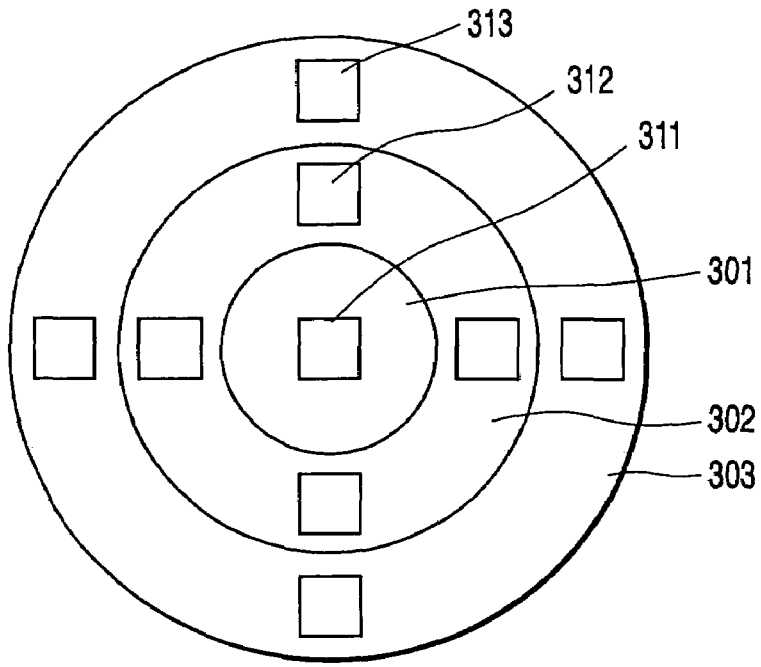
FIG. 10 is a diagram illustrating the relationship between heat sources and the positions of the dose monitor marks.

In the same way as in the first embodiment, resist application (step S101), baking before exposure (step S102), and exposure (step S103) are carried out. As shown in FIG. 10, at the time of exposure, patterns 311, 312, and 313 including the latent images of the dose monitor marks are formed on the resist films at positions corresponding to the positions of the respective heat sources 301, 302, and 303.

Samples performed every repeat of a series of the steps S101 to S103 are baked by temperature settings (step S204). Thereafter, cooling processing (step S105) and development processing (step S106) are carried out. The lengths of the dose monitor marks included in the respective patterns 311, 312, and 313 are measured (step S107).

Further, the relationships between the PEB temperature settings and the lengths of the marks (effective doses) corresponding to the respective heat sources are determined (step S208). Optimum temperature settings corresponding to the respective heat sources are determined by calculating the temperature settings by which the effective doses are made to be the same (the mark lengths are the same) on the basis of the determined relationships corresponding to the respective heat sources (step S209). Calibrations of the temperature settings for the respective heat sources are carried out on the basis of the calculated values (step S210).

The lengths of the dose monitor marks "D.M" and the critical dimensions "CD" before the calibration and after the calibration, and the estimated temperatures before the calibration are shown in Table 3.

TABLE 3

| | Before calibration | | | After calibration | |
|---|---|---|---|---|---|
| Heat sources | D.M [μm] | CD [nm] | Estimated temperatures [° C.] | D.M [μm] | CD [nm] |
| 301 | 14.945 | 0.1923 | 130.24 | 14.934 | 0.1962 |
| 302 | 14.976 | 1.1957 | 129.95 | 14.938 | 0.1946 |
| 303 | 14.985 | 0.1962 | 129.85 | 14.954 | 0.1965 |

The differences "ΔD.M" between the maximum values and the minimum values of the dose monitor marks, the differences "ΔCD" between the maximum values and the minimum values of the critical dimensions, and the difference "ΔEstimated temperature" between the maximum value and the minimum value of the estimated temperatures are shown in Table 4.

TABLE 4

| Before calibration | | | After calibration | |
|---|---|---|---|---|
| ΔD.M [μm] | ΔCD [nm] | Estimated temperatures [° C.] | ΔD.M [μm] | ΔCD [nm] |
| 14.945 | 0.1923 | 130.24 | 14.93.4 | 0.1962 |
| 14.976 | 1.1957 | 129.95 | 14.938 | 0.1946 |
| 14.985 | 0.1962 | 129.85 | 14.954 | 0.1965 |

As shown in Table 4, it has been confirmed that differences between the baking sources with respect to both of the effective doses (D.M) and the critical dimensions are calibrated.

In accordance with the present embodiment, it is possible to suppress that the effective dose which the photosensitive resin film has obtained fluctuates among the apparatuses of respective heat sources due to the temperatures being different from one another among the baking processing apparatuses. Further, improvement of yield can be obtained by manufacturing a semiconductor apparatus by using the apparatuses after calibration.

One example is explained as an applicable example in which the dose monitor marks are used. However, the above-described length measuring means for the marks after exposure is not limited to only an optical microscope or an optical line width length measuring apparatus, but also can be variously applied to a misregistration inspecting apparatus, a SEM, an AFM, or the like. Further, the optical line width length measuring means can be variously applied to a phase difference method, a differential interference method, a method of measuring by a light source with multi-wavelength, or the like. Moreover, a misregistration inspecting function, a line width length measuring function, or the like incorporated in the exposure apparatus itself can be used. Although calibrating by changing setting temperature, if it is the parameter that can change the amount of heating, it will not restrict to this. For example, an effect with the same said also of the temperature up speed of a wafer and temperature down speed is acquired.

Third Embodiment

In the present invention, a method of adjusting a development processing apparatus will be described.

Figure 11:
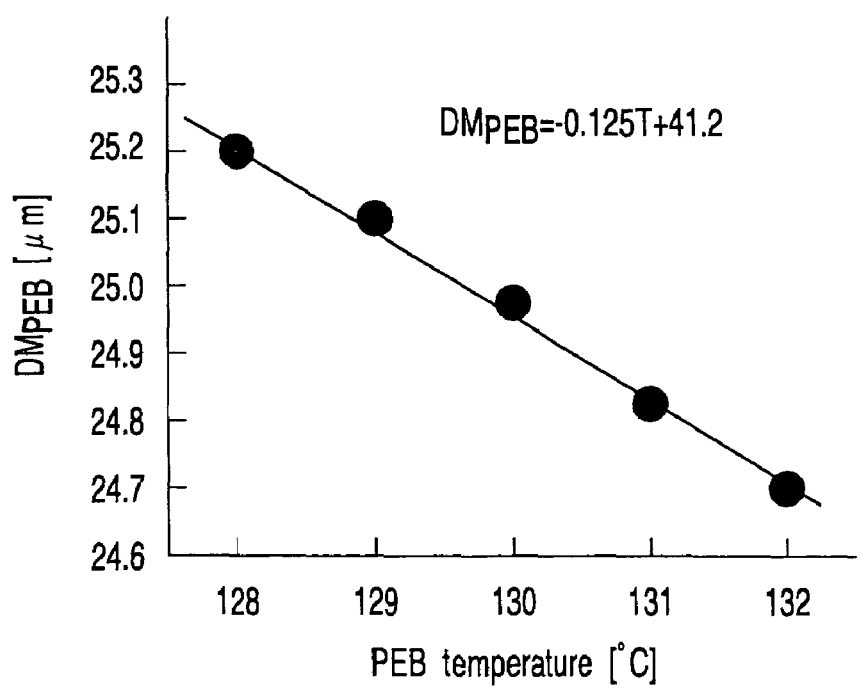
FIG. 11 is a graph showing the relationship between dimensions $DM_{PEB}$ of latent images of the dose monitor marks after cooling processing and PEB temperatures.

Samples on which photoresist film application, baking processing before exposure, exposure, PEB processing, and cooling processing are carried out are prepared. The respective samples are baked by temperature settings at the time of the PEB processing. The samples that are baked by the same temperature setting exist. After the cooling processing, the dimensions of the latent images of the dose monitor marks ($DM_{PEB}$: effective doses) are measured by an optical line width length measuring apparatus. The measured results are shown in FIG. 11.

In accordance therewith, it has been understood that the relationship between a PEB temperature T (° C.) and a dimension of a mark $DM_{PEB}$ (μm) is expressed by the following formula.

$$DM_{PEB} = -0.125T + 41.2 \tag{2}$$

Figure 12B:
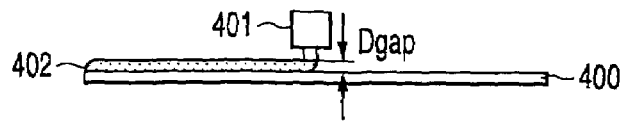
FIGS. 12A and 12B are diagrams illustrating a configuration of a development processing apparatus according to a third embodiment of the invention.
Figure 12A:
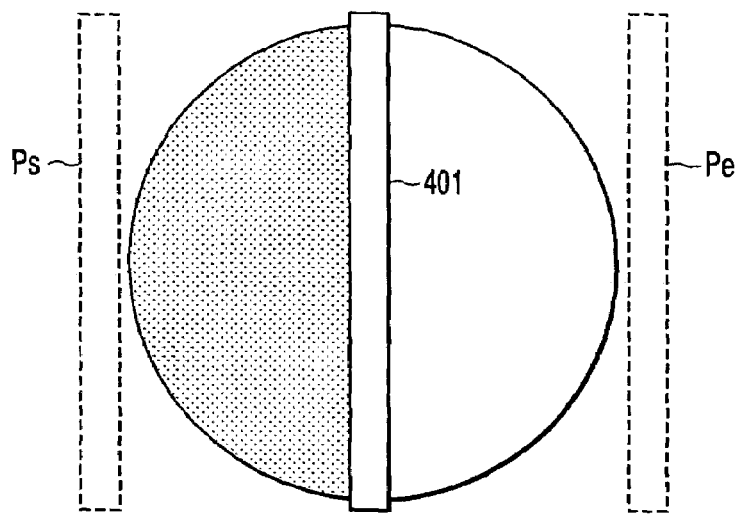

A development processing apparatus shown in FIGS. 12A and 12B is prepared. FIGS. 12A and 12B are diagrams illustrating a configuration of the development processing apparatus according to a third embodiment of the present invention. FIG. 12A is a plan view and FIG. 12B is a sectional view.

The development apparatus has a nozzle 401 discharging a developing solution 402 with respect to a substrate 400. The length in the longitudinal direction of the nozzle 401 is a length greater than or equal to the diameter of the substrate. Due to the nozzle 401 being moved from an application start position $P_s$ to an application end position $P_e$ in a state of discharging the developing solution 402, the developing solution 402 is supplied on the substrate 400.

The samples that are baked the same temperature setting are developed by distances $D_{gap}$ between the nozzle 401 and the substrate 400.

Figure 13:
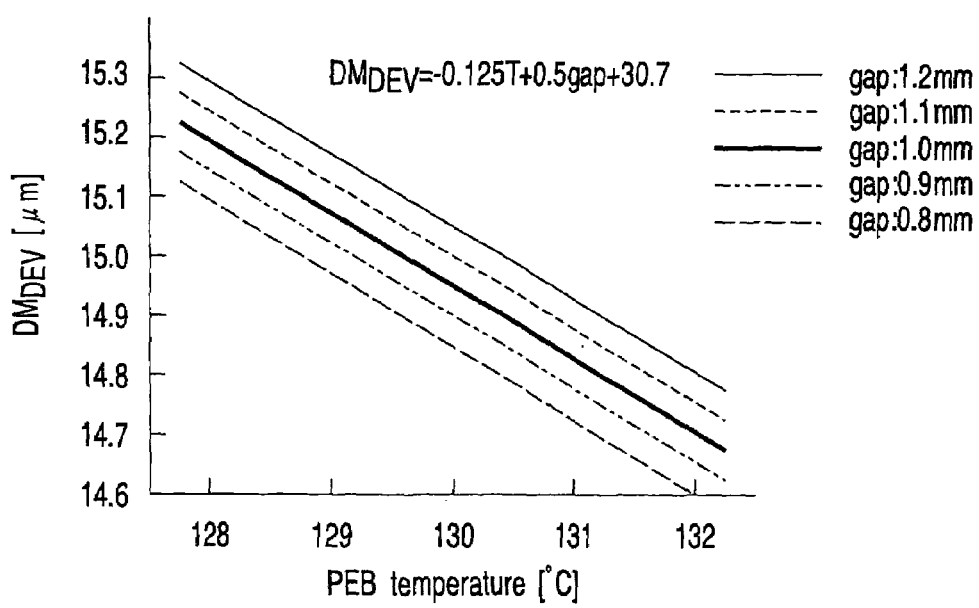
FIG. 13 is a graph showing gap dependency of the relationship between PEB temperatures and dimensions $DM_{DEV}$ of the dose monitor marks after development processing.

After the development processing, the dimensions of the dose monitor marks ($DM_{DEV}$: effective doses) are measured by an optical line width length measuring apparatus. The measured results are shown in FIG. 13. It has been understood therefrom that the relationship between a PEB temperature (T), a distance between the developing nozzle and the substrate ($D_{gap}$), and an effective dose ($DM_{PEB}$) is expressed by the following formula.

$$DM_{DEV} = -0.125T + 0.5D_{gap} + 30.7 \tag{3}$$

Figures 14, 15:
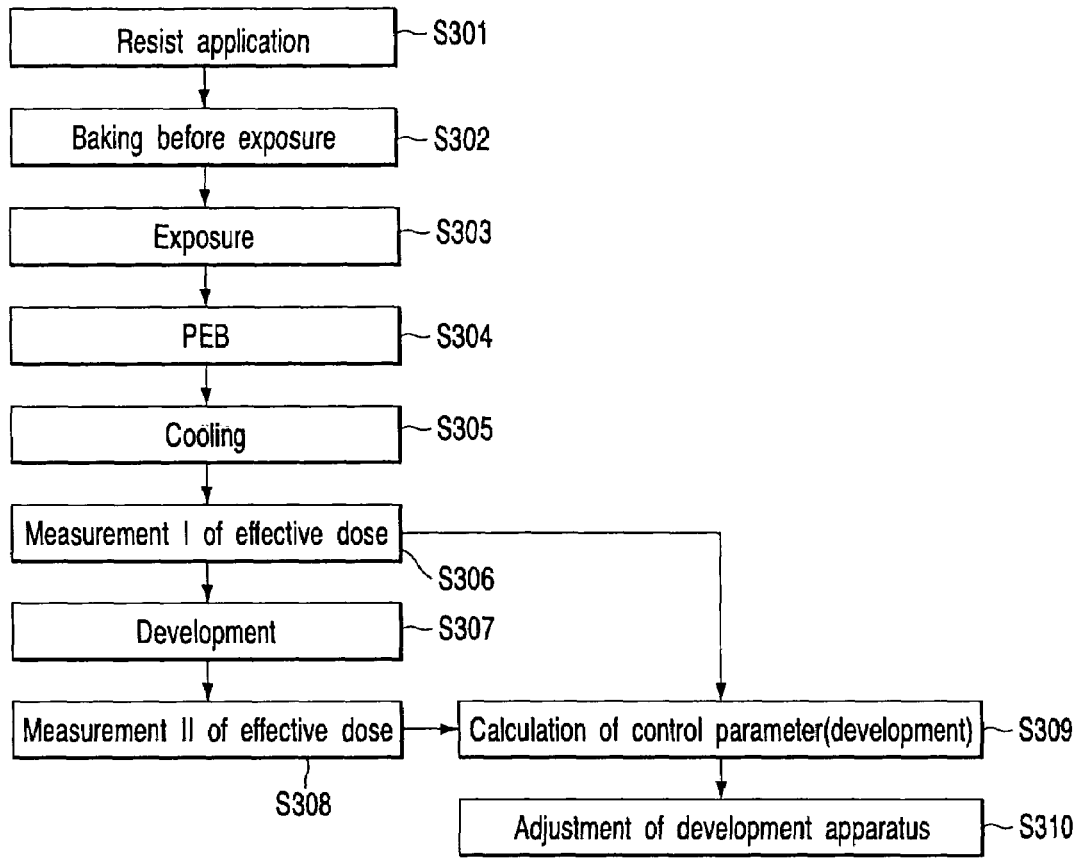
FIG. 14 is a flowchart showing the procedure of an adjusting method for the development processing apparatus according to the third embodiment.
FIG. 15 is a table showing the distribution of dimensions $DM_{PEB}$ of the latent images of the dose monitor marks after baking processing.

A method of adjusting the development processing apparatus of the present application will be described by using a flowchart of FIG. 14. FIG. 14 is a flowchart showing the procedure of the adjusting method for a development processing apparatus according to the third embodiment of the invention.

First, an application of a resist film (step S301) and baking processing before exposure (step S302) are carried out. By transferring the mask patterns for a dose monitor marks formed on the mask shown in FIG. 2 onto the resist film at a pitch of 30 mm in the both directions of X and Y, the latent images of the dose monitor marks are formed (step S303). A plurality of samples to which the PEB temperature settings are allocated and on which the PEB processings are carried out are prepared (step S304). After the PEB processings, cooling processing for the substrate is carried out (step S305).

The dimensions of the latent images of the dose monitor marks are measured after the cooling processing (step S306). The dimensions of the latent images of the dose monitor marks after the cooling processing are represented as shown in FIG. 15. A distribution of the dimensions of the latent images in the surface of the substrate is represented as shown in FIG. 16. The distribution is made a concentric distribution as shown in FIG. 16. The distribution of temperatures in the surface substrate is calculated as shown in FIG. 17 by formula (2).

Moreover, development processing is carried out with respect to the substrate (step S307), the dimensions of the respective dose monitor marks are measured (step S308). The dimensions of the respective dose monitor marks after the development processing are represented as shown in FIG. 18. A distribution of the dimensions of the latent images in the surface of the substrate is represented as shown in a plan view of FIG. 19. Distances between the developing nozzle and the substrate are determined by the values of FIG. 17 and FIG. 18 are substituted into formula (3). The distribution of distances is represented as shown in FIG. 20. It is determined that the reason that the distribution of the distances are represented as shown in FIG. 20 is that the developing method used here is a method in which a developing solution is supplied while causing the rectilinear developing nozzle to be scanned from the −x direction to the +x direction of the substrate. Therefore, the distances between the nozzle and the substrate have been not adjusted so as to be the same, and the distance is adjusted so as to be 1 mm (steps S309 and S310).

In the present embodiment, adjustment for the development processing apparatus is carried out on the basis of the measured results of the dose monitor marks after the baking processing and after the development processing. However, as shown in a flowchart of FIG. 22, it is possible to adjust on the basis of only the measured results after the development processing as well. For example, in a developing method such that the developing solution is supplied by causing the nozzle to be scanned from one end to the other end of a wafer while discharging a developing solution from the rectilinear nozzle, the distribution of the effective doses is preferably determined by averaging the calculated effective doses on the scanning lines at the same positions of the nozzle. The distribution of the mark lengths $DM_{DEV}$ (doses) shown in FIG. 19 is made to be that as shown in FIG. 23 when the average value of the dose monitor mark lengths $DM_{DEV}$ on the lines scanned by a position where there is the nozzle. It is recommended that a distribution of the discharged amounts from the nozzle be adjusted or a gap be adjusted such that the distribution of the doses are made to be as constant as possible.

Figure 24:
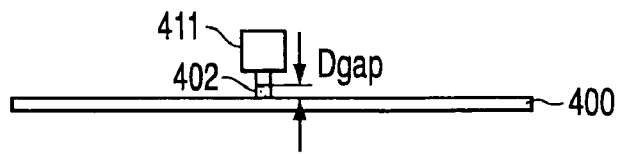
FIGS. 24A and 24B are diagrams illustrating a configuration of the development processing apparatus according to the third embodiment.
Figure 24:
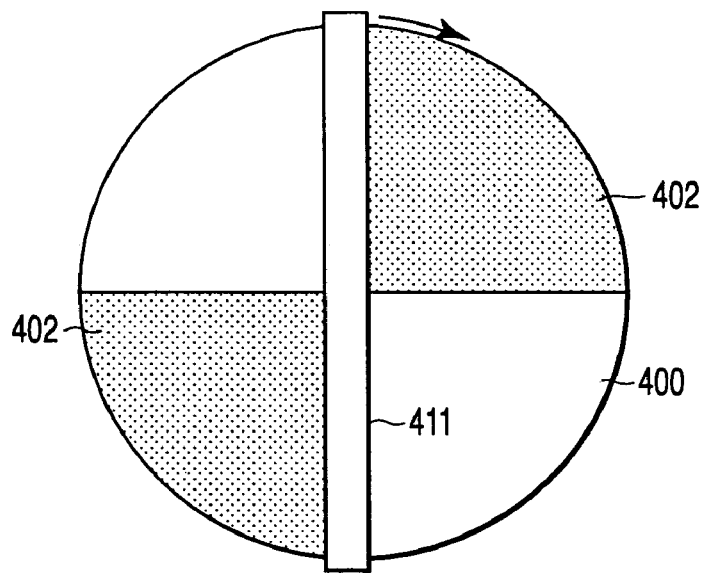
Figure 25:
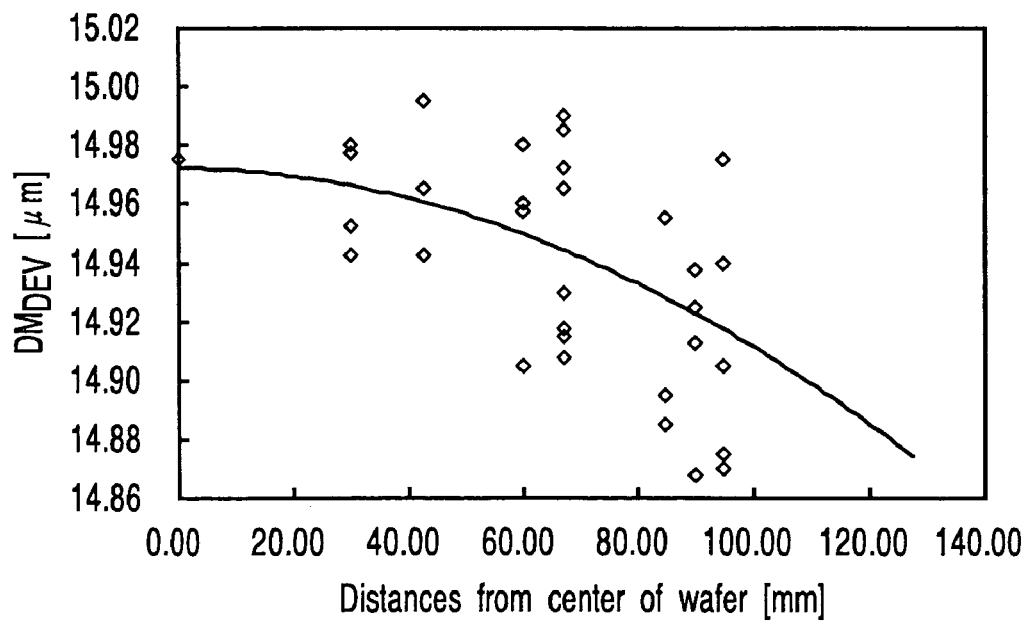
FIG. 25 is a graph showing a distribution of average values of the dose monitor mark length $DM_{DEV}$ on lines scanned by a position where the nozzle exists.

Further, as shown in FIGS. 24A and 24B, in a developing method such that a developing solution is supplied by rotating a wafer while discharging the developing solution from the rectilinear nozzle as well, a distribution of the effective doses is preferably determined by averaging the calculated effective doses on the scanning lines (on the concentric circle) at the same positions of a nozzle 411. FIG. 24A is a plan view, and FIG. 24B is a sectional view. When the distribution of the doses shown in FIG. 19 is averaged on the scanning lines (on the concentric circle), the distribution is made to be that as shown in FIG. 25. It is recommended that a distribution of the discharge amounts from the nozzle be adjusted or a gap be adjusted such that the distribution of the doses are made to be as constant as possible.

These techniques can be applied to an evaluating method of the nozzle by which it is investigated whether a distribution of the quantity of flow in the longitudinal direction of the nozzle is uniform or not.

The adjustment of the development processing apparatuses shown in FIG. 13, and FIGS. 24A and 24B can be applied to adjustment for the differences among a plurality of apparatuses. In this case, the distribution of the effective doses is not determined, it is recommended that an average value of the effective doses of the respective processing apparatuses be determined in advance, and discharged amounts from the nozzle, gaps, temperatures of the developing solution, temperatures of ambient atmosphere, or the like be adjusted such that an average value of the effective doses of the respective processing apparatuses are made to be equal to one another.

In accordance with the present embodiment, the distribution of the temperatures in baking processing after exposure and uneven development at the time of development processing is simultaneously calibrated by development processing, so that a shortening of an adjusting time can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature calibration method for a baking processing apparatus, comprising:
    forming a photosensitive resin film onto a substrate;
    preparing an exposure mask having a mask pattern for a dose monitor mark to monitor an effective dose on the substrate;
    forming a latent image of the dose monitor mark by using an exposure apparatus to transfer the mask pattern for the dose monitor mark onto the photosensitive resin film at a predetermined dose;
    preparing baking processing apparatuses;
    baking the substrate, on which the latent image is formed, at a predetermined temperature by using each of the baking processing apparatuses;
    cooling the baking-processed substrate;
    measuring a length of the latent image of the dose monitor mark obtained by a developing process;
    determining a relationship between a temperature setting and an effective dose; and
    calibrating the temperature setting of each of the baking processing apparatuses to obtain a predetermined effective dose based on the determined relationship and the measured length corresponding to each of the baking processing apparatuses.

2. A temperature calibration method for a baking processing apparatus, according to claim 1, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in the one direction, and a ratio of dimensions of the shielding portion and the translucent portion of the block is monotonously varied in the one direction.

3. A temperature calibration method for a baking processing apparatus, according to claim 2, wherein, given that an exposure wavelength of the exposure apparatus is $\lambda$, a numerical aperture at a wafer side is NA, and a coherence factor is $\sigma$, a pitch P on the wafer satisfies:

$$\lambda/P \geq (1+\sigma)NA.$$

4. A method of manufacturing a semiconductor apparatus, comprising baking a photosensitive resin film which has been formed on a semiconductor substrate and on which a semiconductor device pattern has been transferred by using the baking processing apparatus calibrated by using the temperature calibration method for a baking processing apparatus according to claim 1.

5. A temperature calibration method for baking processing apparatus, comprising:
- forming a photosensitive resin film onto a substrate;
- preparing an exposure mask having disposed thereon a mask pattern for a dose monitor mark to monitor an effective dose on the substrate;
- preparing a baking processing apparatus having a plurality of heat sources;
- forming latent images of the dose monitor mark by transferring, at a predetermined dose, the mask pattern for the dose monitor mark onto the photosensitive resin film at a position corresponding to a position of each of the heat sources, by using an exposure apparatus;
- baking the substrate having the latent images of the dose monitor mark formed thereon using the baking processing apparatus with a predetermined temperature setting corresponding to each of the heat sources;
- cooling the baking-processed substrate;
- measuring lengths of the latent images of the dose monitor marks after the cooling or a length of a dose monitor mark obtained by developing the photosensitive resin film on the cooling-processed substrate;
- determining in advance a relationship between a temperature setting and a length of the latent image of the dose monitor mark, or a temperature setting and a length of the dose monitor mark corresponding to each of the heat sources; and
- calibrating the temperature setting corresponding to each heat source to obtain the same dose at a position of the photosensitive resin film corresponding to each heat source, on the basis of each determined relationship and the measured length corresponding to each heat source.

6. A temperature calibration method for a baking processing apparatus, according to claim 5, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in the one direction, and a ratio of dimensions of the shielding portion and the translucent portion of the block is monotonously varied in the one direction.

7. A temperature calibration method for a baking processing apparatus, according to claim 6, wherein, given that an exposure wavelength of the exposure apparatus is $\lambda$, a numerical aperture at a wafer side is NA, and a coherence factor is $\sigma$, a pitch P on the wafer satisfies:

$$\lambda/P \geq (1+\sigma)NA.$$

8. A method of manufacturing a semiconductor apparatus, comprising baking a photosensitive resin film which has been formed on a semiconductor substrate and on which a semiconductor device pattern has been transferred by using the baking processing apparatus calibrated by using the temperature calibration method for a baking processing apparatus according to claim 5.

9. An adjusting method for a development processing apparatus, comprising:
- forming a photosensitive resin film onto a substrate;
- preparing an exposure mask having a mask pattern for a dose monitor mark to monitor an effective dose to be formed in the photosensitive resin film;
- forming latent images of the dose monitor mark by transferring the mask pattern for the dose monitor mark onto positions of the photosensitive resin film at a predetermined dose;
- baking the substrate, on which the latent image is formed, at a predetermined temperature by using each of the baking processing apparatuses;
- cooling the baking-processed substrate;
- measuring lengths of the latent images of dose monitor marks after the cooling;
- developing the photosensitive resin film by using a development processing apparatus with a control parameter being set up to form dose monitor marks;
- measuring lengths of dose monitor marks after the developing;
- calculating an optimum control parameter of the development processing apparatus on the basis of the lengths of the latent images of dose monitor marks and the lengths of dose monitor marks;
- setting the optimum control parameter of the development processing apparatus;
- determining a first relationship between a baking temperature at the time of baking and the length of the latent image of the dose monitor mark in advance;
- determining a second relationship among a baking temperature at the time of baking, the control parameter of the development processing apparatus, and the length of the dose monitor mark in advance;
- determining a distribution of baking temperatures on the basis of the length of the latent image of each dose monitor mark and the first relationship at the time of calculating the control parameter;
- determining a distribution of the control parameters on the basis of the determined distribution of the baking temperatures, the length of each dose monitor mark measured after the developing, and the second relationship; and
- calculating the optimum control parameter such that the distribution of the control parameters is made to be uniform based on the determined distribution.

10. An adjusting method for a development processing apparatus, according to claim 9, wherein the development processing apparatus discharges a developing solution to the photosensitive resin film, and causes a nozzle whose length in a longitudinal direction thereof is greater than a maximum width of the substrate to be relatively scanned with respect to the substrate.

11. An adjusting method for a development processing apparatus, according to claim 10, further comprising:
- determining a first relationship between a baking temperature at the time of baking and the length of the latent image of the dose monitor mark in advance; and
- determining a second relationship among a baking temperature at the time of baking, a distance between the nozzle and a surface of the photosensitive resin film, and the length of the dose monitor mark in advance, wherein
- determining a distribution of baking temperatures on the basis of the length of the latent image of each dose monitor mark measured after the cooling and the first relationship, at the time of calculating the control parameter,
- determining a distribution of the distances on the basis of the determined distribution of the baking temperatures, the length of each dose monitor mark measured after the developing, and the second relationship, and
- calculating the optimum control parameter such that the distribution of the distances is made to be uniform based on the determined distribution.

12. An adjusting method for a development processing apparatus, according to claim 10, wherein the control parameter of the development processing apparatus is at least one of a distribution of flow rates in the longitudinal direction of the developing nozzle, a flow rate of the developing solution, and a distance between the developing nozzle and the substrate.

13. An adjusting method for a development processing apparatus, according to claim 9, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in one direction, and a ratio of dimensions of the shielding portion and the translucent portion of the block is monotonously varied in the one direction.

14. An adjusting method for a development processing apparatus, according to claim 13, wherein, given that a wavelength of an exposure light of the exposure apparatus is λ, a numerical aperture at a side of the substrate of the exposure apparatus is NA, a coherence factor of the exposure apparatus is σ, and a width in the one direction of a projected image corresponding to the block when the mask pattern for a dose monitor mark is projected on the resist film by using the exposure apparatus is P:

$\lambda/P \geq (1+\sigma)NA$.

15. A method of manufacturing a semiconductor apparatus, comprising developing a photosensitive resin film by using a development processing apparatus adjusted by using the adjusting method for a development processing apparatus according to claim 9.

16. An adjusting method for a development processing apparatus, comprising:
    forming a photosensitive resin film onto a substrate;
    preparing an exposure mask having a mask pattern for a dose monitor mark to monitor an effective dose to be formed in the photosensitive resin film;
    forming latent images of the dose monitor mark by transferring the mask pattern for the dose monitor mark onto positions of the photosensitive resin film at a predetermined dose;
    baking the substrate having the latent images of the dose monitor mark formed thereon;
    cooling the baking-processed substrate;
    preparing a development processing apparatus which discharges a developing solution to the photosensitive resin film, and which causes a nozzle, whose length in a longitudinal direction thereof is greater than a maximum width of the substrate, to be relatively scanned with respect to the substrate;
    developing the photosensitive resin film by using a development processing apparatus with which a control parameter is set up to form dose monitor marks;
    measuring lengths of the dose monitor marks after the developing;
    calculating average values of the lengths of the dose monitor marks positioned on lines scanned by a position of the nozzle;
    determining a distribution of the lengths of the dose monitor marks in the longitudinal direction of the nozzle on the basis of the average values;
    calculating the control parameter of the development processing apparatus on the basis of the lengths of the latent images of the dose monitor marks and the lengths of the dose monitor marks; and
    adjusting the control parameter of the development processing apparatus in accordance with the calculated control parameter.

17. An adjusting method for a development processing apparatus, according to claim 16, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in one direction, and a ratio of dimensions of the shielding portion and the translucent portion of the block is monotonously varied in the one direction.

18. An adjusting method for a development processing apparatus, according to claim 17, wherein, given that a wavelength of an exposure light of the exposure apparatus is λ, a numerical aperture at a side of the substrate of the exposure apparatus is NA, and a coherence factor of the exposure apparatus is σ, a width in the one direction of a projected image corresponding to the block when the mask pattern for the dose monitor mark is projected on the resist film by using the exposure apparatus is P:

$\lambda/P \geq (1+\sigma)NA$.

19. An adjusting method for a development processing apparatus, according to claim 16, wherein the control parameter of the development processing apparatus is at least one of a distribution of flow rates in the longitudinal direction of the developing nozzle, a flow rate of the developing solution, and a distance between the developing nozzle and the substrate.

20. A method of manufacturing a semiconductor apparatus, comprising developing a photosensitive resin film by using a development processing apparatus adjusted by using the adjusting method for a development processing apparatus according to claim 16.

21. An adjusting method for a development processing apparatus, comprising:
    forming a photosensitive resin film onto a substrate;
    preparing an exposure mask having a mask pattern for a dose monitor mark to monitor an effective dose to be formed in the photosensitive resin film;
    forming latent images of the dose monitor mark by transferring the mask pattern for the dose monitor mark onto positions of the photosensitive resin film at a predetermined dose;
    baking the substrate having the latent images of the dose monitor mark formed thereon;
    cooling the baking-processed substrate;
    measuring a length of the latent images of the dose monitor mark after the cooling;
    calculating an average value of the lengths of the latent images of the dose monitor marks measured after the cooling;
    preparing development processing apparatuses;
    developing the photosensitive resin film for every repetition of the forming the photosensitive resin film, the forming the latent images, the baking, the cooling, the measuring and the calculating, with each development processing apparatus, to form dose monitor marks;
    measuring lengths of dose monitor marks corresponding to each development processing apparatus after the developing;
    calculating an average value of the lengths of the dose monitor marks corresponding to the each development processing apparatus on the basis of the length of each dose monitor mark;
    calculating control parameters corresponding to the each development processing apparatus on the basis of the average value of the lengths of the latent images of the dose monitor marks, and the average value of the lengths of the dose monitor marks; and setting one of the control parameters which is selected from the control parameters for the development processing apparatus as an optimum control parameter.

22. An adjusting method for a development processing apparatus, according to claim 21, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in the one direction, and a ratio of dimensions of the shielding portion and the translucent portion of the block is monotonously varied in the one direction.

23. An adjusting method for a development processing apparatus, according to claim 22, wherein, given that a wavelength of an exposure light of the exposure apparatus is λ, a numerical aperture at a side of the substrate of the exposure apparatus is NA, a coherence factor of the exposure apparatus is σ, a width in the one direction of a projected image corresponding to the block when the mask pattern for a dose monitor mark is projected on the resist film by using the exposure apparatus is P:

$$\lambda/P \geq (1+\sigma)NA.$$

24. An adjusting method for a development processing apparatus, according to claim 21, wherein the development processing apparatus discharges a developing solution to the photosensitive resin film, and causes a nozzle whose length in a longitudinal direction thereof is greater than a maximum width of the substrate to be relatively scanned with respect to the substrate.

25. An adjusting method for a development processing apparatus, according to claim 24, wherein the control parameter of the development processing apparatus is at least one of a distribution of flow rates in the longitudinal direction of the developing nozzle, a flow rate of the developing solution, a distance between the developing nozzle and the substrate.

26. A method of manufacturing a semiconductor apparatus, comprising developing a photosensitive resin film by using a development processing apparatus adjusted by using the adjusting method for a development processing apparatus according to claim 21.

27. An adjusting method for a development processing apparatus, comprising:

forming a photosensitive resin film onto a substrate;

preparing an exposure mask having a mask pattern for a dose monitor mark to monitor an effective dose to be formed in the photosensitive resin film;

forming latent images of the dose monitor mark by transferring the mask pattern for the dose monitor mark onto positions of the photosensitive resin film at a predetermined dose;

baking the substrate having the latent images for the dose monitor marks formed thereon;

cooling the baking-processed substrate;

preparing a plurality of development processing apparatuses;

developing the photosensitive resin film to form dose monitor marks performed for every repetition of the forming the photosensitive resin film, the forming the latent images, the baking and the cooling, with the each development processing apparatus;

measuring a length of each of the dose monitor marks corresponding to each development processing apparatus after the developing;

calculating average values of the lengths of the dose monitor marks corresponding to the each development processing apparatus;

calculating control parameters corresponding to the each development processing apparatus on the basis of the average values of the lengths of the dose monitor marks corresponding to the each development processing apparatus; and adjusting the control parameters of the each development processing apparatus in accordance with the calculated control parameters.

28. An adjusting method for a development processing apparatus, according to claim 27, wherein the mask pattern for the dose monitor mark is a pattern in which a plurality of blocks having shielding portions and translucent portions arranged therein in one direction within a constant width p which cannot be resolved by the projective exposure apparatus are intermittently or serially arranged in the one direction, and a ratio of dimensions of the shielding portion and the translucent portion of the block is monotonously varied in the one direction.

29. An adjusting method for a development processing apparatus, according to claim 28, wherein, given that a wavelength of an exposure light of the exposure apparatus is λ, a numerical aperture at a side of the substrate of the exposure apparatus is NA, a coherence factor of the exposure apparatus is σ, a width in the one direction of a projected image corresponding to the block when the mask pattern for a dose monitor mark is projected on the resist film by using the exposure apparatus is P:

$$\lambda/P \geq (1+\sigma)NA.$$

30. An adjusting method for a development processing apparatus, according to claim 27, wherein the development processing apparatus discharges a developing solution with respect to the photosensitive resin film, and causes a nozzle whose length in a longitudinal direction thereof is greater than a maximum width of the substrate to be relatively scanned with respect to the substrate.

31. An adjusting method for a development processing apparatus, according to claim 30, wherein the control parameter of the development processing apparatus is at least one of a distribution of flow rates in the longitudinal direction of the developing nozzle, a flow rate of the developing solution, and a distance between the developing nozzle and the substrate.

32. method of manufacturing a semiconductor apparatus, comprising developing a photosensitive resin film by using a development processing apparatus adjusted by using the adjusting method for a development processing apparatus according to claim 27.

* * * * *